(12) United States Patent
Takagi

(10) Patent No.: US 6,737,868 B2
(45) Date of Patent: May 18, 2004

(54) ELECTRICAL LOAD DISCONNECTION DETECTING APPARATUS

(75) Inventor: Nobutomo Takagi, Okazaki (JP)

(73) Assignee: Denso Corporation, Kariya (JP)

( * ) Notice: Subject to any disclaimer, the term of this patent is extended or adjusted under 35 U.S.C. 154(b) by 19 days.

(21) Appl. No.: 10/279,997

(22) Filed: Oct. 25, 2002

(65) Prior Publication Data

US 2003/0085711 A1 May 8, 2003

(30) Foreign Application Priority Data

Nov. 7, 2001 (JP) ........................................ 2001-342102

(51) Int. Cl.⁷ .............................. G01R 31/02; G05F 3/02
(52) U.S. Cl. ...................... 324/414; 324/537; 324/511; 327/536
(58) Field of Search ................................ 324/414, 510, 324/511, 522, 503, 113, 537–538; 327/536

(56) References Cited

U.S. PATENT DOCUMENTS 4,894,648 A * 1/1990 Talbot ........................ 370/464
5,337,013 A * 8/1994 Langer et al. ............... 324/537
5,589,802 A * 12/1996 O'Shaughnessy et al. .... 331/44
6,611,166 B2 * 8/2003 Chan et al. .................. 327/536

FOREIGN PATENT DOCUMENTS

| JP | A-S56-121296 | 9/1981 |
| JP | A-H07-201471 | 8/1995 |
| JP | A-2000-74977 | 3/2000 |

* cited by examiner

Primary Examiner—Anjan K. Deb
(74) Attorney, Agent, or Firm—Posz & Bethards, PLC

(57) ABSTRACT

A disconnection detecting apparatus for detecting disconnection of lamps includes a resistor, a differential amplifier, a microcomputer, and a charge pump circuit. The resistor is connected to detect current flowing in the lamps. The voltage that appears at the ends of the resistor is applied to the input terminals of the differential amplifier circuit. The microcomputer detects disconnection of the lamps by comparing the output voltage with a reference. The charge pump circuit increases a battery voltage to a boosted voltage. This boosted voltage is supplied to an operational amplifier in the differential amplifier circuit.

5 Claims, 7 Drawing Sheets

ELECTRICAL LOAD DISCONNECTION DETECTING APPARATUS

CROSS REFERENCE TO RELATED APPLICATION

This application is based on and incorporates herein by reference Japanese Patent Application No. 2001-342102 filed on Nov. 7, 2001.

FIELD OF THE INVENTION

The present invention relates to an electrical load disconnection detecting apparatus.

BACKGROUND OF THE INVENTION

An electrical load disconnection detecting apparatus is shown in FIG. 8. This apparatus is especially used in a vehicle for detecting disconnection of electrical loads, such as taillights or stoplights. The apparatus includes a differential amplifier circuit 14, a noninverting amplifier circuit 16, and a microcomputer 18. A resistor 12 for current-voltage conversion is connected in series with a path for supplying a current to lamps L1–Ln.

Voltages that appear at each end of the resistor 12 are inputted to the differential amplifier circuit 14. An output Vout1 of the differential amplifier circuit 14 is amplified by the noninverting amplifier circuit 16. The amplified voltage Vout2 is inputted to the microcomputer 18 and compared with a reference to determine whether disconnection exists.

In this apparatus, two amplifiers 20, 25, one is for the differential amplifier circuit 14 and the other is for the noninverting amplifier circuit 16, are required. This makes the apparatus large and costly.

SUMMARY OF THE INVENTION

The present invention therefore has an objective to reduce the size and the cost of the electrical load disconnection detecting apparatus.

The electrical load disconnection detecting apparatus of the present invention includes a resistor for current-voltage conversion, a differential amplifier circuit, a disconnection detecting device, and a charge pump circuit. The resistor is connected in series with a path for supplying power to an electrical load to be monitored. Voltages that appear at the ends of the resistor are inputted to the differential amplifier circuit. The charge pump circuit increases the battery voltage and supplies the increased voltage to an operational amplifier included in the differential amplifier circuit.

Because the operational amplifier is supplied with the amplified operating voltage, it can output an amplified output voltage to the detecting device. Therefore, the detecting device can perform accurate detection. Furthermore, the charge pump circuit can be constructed small and at low cost as compared with the noninverting amplifier circuit.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

The preferred embodiments of the present invention will be explained with reference to various embodiments in the accompanying drawings. The same or similar component parts are designated with the same or similar reference numbers throughout the embodiments.

First Embodiment

Figure 1:
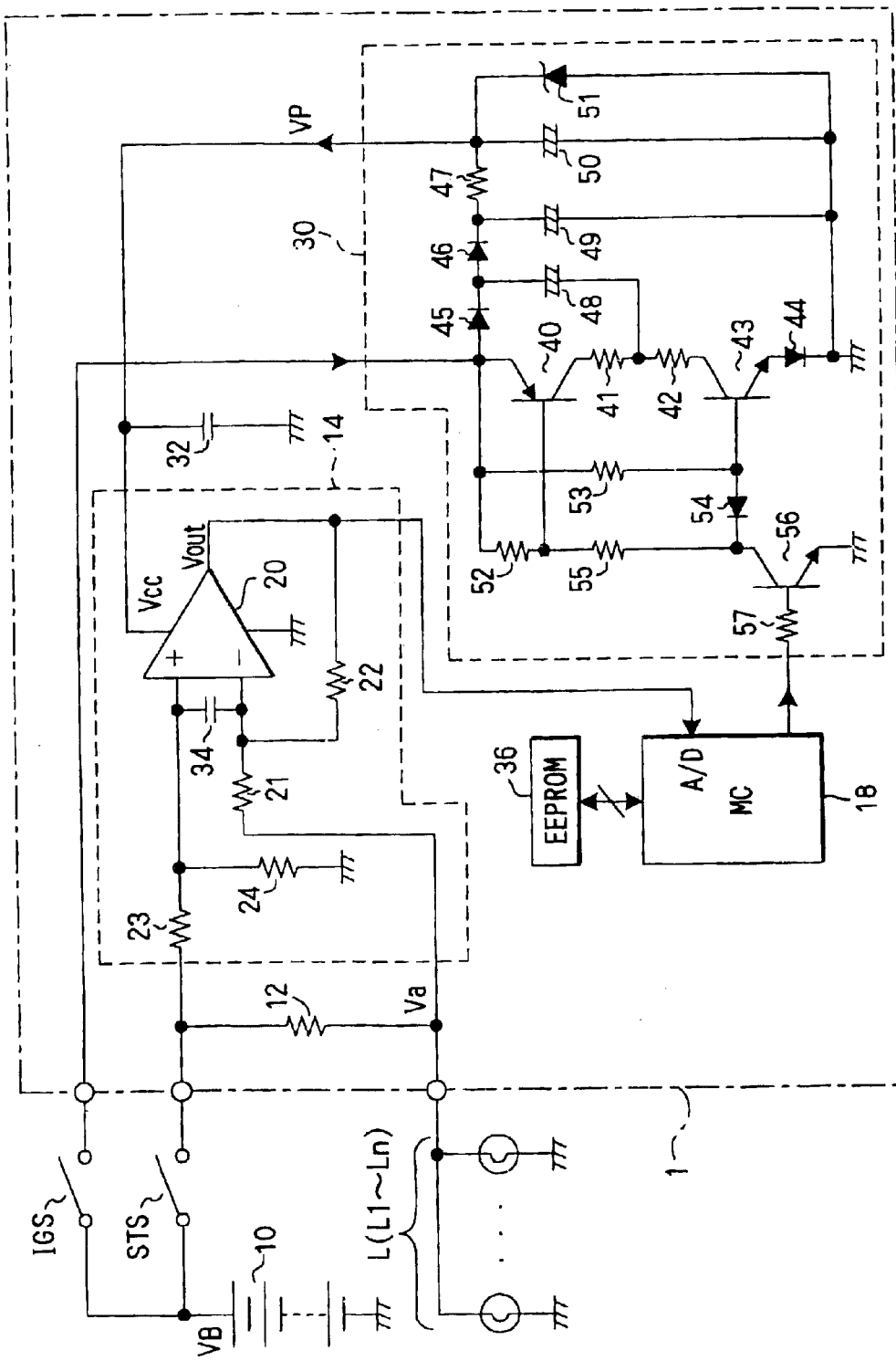
FIG. 1 is a circuit diagram showing a disconnection detecting apparatus of the first embodiment of the present invention.

Referring to FIG. 1, a disconnection detecting apparatus 1 includes a differential amplifier circuit 14, a microcomputer (MC) 18, a charge pump circuit 30 (charge pump circuit), and an EEPROM 36. The apparatus 1 detects disconnection of lamps L1–Ln. The differential amplifier includes an operational amplifier 20. A resistor 12 for current-voltage conversion is connected in series with a path for supplying a current to the lamps L1–Ln.

A capacitor 32 is connected to the line that is for supplying the voltage Vcc to the operational amplifier 20 for stabilizing the voltage Vcc. A capacitor 34 is connected between input terminals of the operational amplifier 20 to reduce malfunctions caused by noise. The EEPROM 36 is a nonvolatile memory for storing data on output errors of the differential amplifier circuit 14. It is connected to the microcomputer 18 in a manner that data is transferable between the EEPROM 36 and the microcomputer 18.

The charge pump circuit 30 includes a PNP transistor 40, resistors 41, 42, 47, an NPN transistor 43, diodes 44, 45, 46, capacitors 48, 49, 50, and a zener diode 51. The PNP transistor 40 is supplied with the battery voltage VB via its emitter and an ignition switch IGS. The resistor 41 is connected to the collector of the transistor 40 and to the resistor 42. The resistor 42 is connected to the collector of the NPN transistor 43.

The anode and the cathode of the diode 44 are connected to the emitter of the transistor 43 and the ground, respectively. The anode and the cathode of the diode 45 are connected to the emitter of the transistor 40 and the anode of the diode 46. The cathode of the diode 46 is connected to the resistor 47. The capacitor 48 is connected to the cathode of the diode 45 and between the resistors 41 and 42.

The capacitors 49, 50 are connected between each end of the resistor 47 and the ground, respectively. The zener diode 51 is connected in parallel with the capacitor 50, and its anode is grounded.

The charge pump circuit 30 further includes resistors 52, 53, 55, 57, a diode 54, and an NPN transistor 56. The resistor 52 is connected between the emitter and the base of the PNP transistor 40. The resistor 53 is connected between the emitter of the PNP transistor 40 and the base of the NPN transistor 43. The anode of the diode 54 is connected to the base of the NPN transistor 43.

The resistor 55 is connected between the base of the PNP transistor 40 and the cathode of the diode 54. The collector of the NPN transistor 56 is connected to the connecting point of the diode 54 and the resistor 55. The emitter of the NPN transistor 56 is connected to the ground. The resistor 57 is connected between the base of the transistor 56 and the output port of the microcomputer 18. Most components of the charge pump circuit 30 are constructed in chip form.

When the stop switch (brake pedal switch) STS is closed under the condition that the switch IGS is held closed, the battery voltage VB is applied across the resistor 12. Voltages that appear at the ends of the resistor 12 are applied to noninverting and inverting terminals of the operational amplifier 20, respectively. The charge pump circuit 30 increases the battery voltage VB to a higher voltage VP. The voltage VP is supplied to the operational amplifier 20 for an operating voltage Vcc. An output Vout of the operational amplifier 20 is applied to the A/D terminal of the microcomputer 18.

The EEPROM 36 stores output error data of the differential amplifier circuit 14. In the manufacturing process of the apparatus 1, a current Is is fed to the resistor 12 so that the output voltage Vout becomes the predetermined voltage S. The microcomputer 18 writes an output error of the differential amplifier circuit 14 into the EEPROM 36. The output error is determined by calculating a difference between an actual output voltage Vout of the differential amplifier circuit 14 and the predetermined voltage S.

If a current that raises the output voltage Vout to 3 V is fed to the resistor 12 and the actual output voltage Vout is 3.1 V, the differential value 0.1 V is stored in the EEPROM 36 as an output error. The microcomputer 18 corrects the output voltage Vout by subtracting 0.1 V or the reference voltage by adding 0.1 V for the disconnection determination.

Figure 6A:
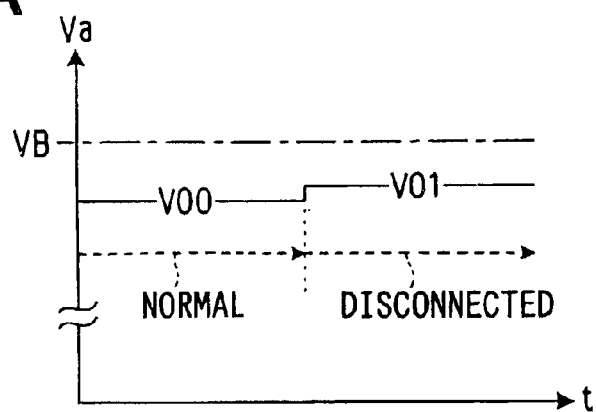
FIG. 6A is a diagram showing a voltage Va under the conditions that lamp connection is normal and abnormal.
Figure 6B:
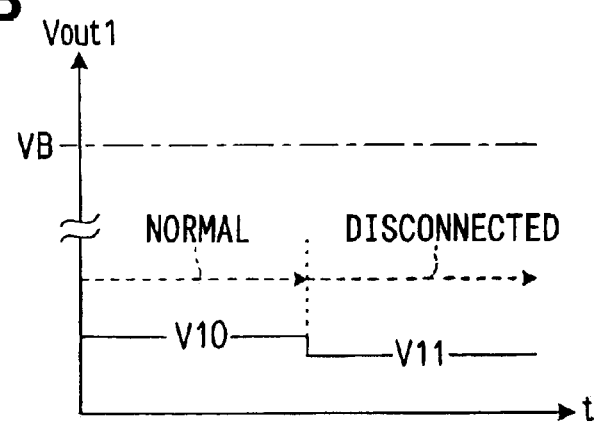
FIG. 6B is a diagram showing a voltage Vout1 under the conditions that lamp connection is normal and abnormal.

A voltage Va that appears at the connecting point of the resistor 12 and the lamps L1–Ln is amplified with the reversed polarity. The output voltage Vout of the differential amplifier circuit 14 becomes lower as shown in FIG. 6B as the voltage Va becomes higher due to disconnection of the lamp. When the connection is normal, the voltage Vout reaches the maximum voltage V10. When the connection is abnormal, the voltage Vout becomes the voltage V11.

Figure 7A:
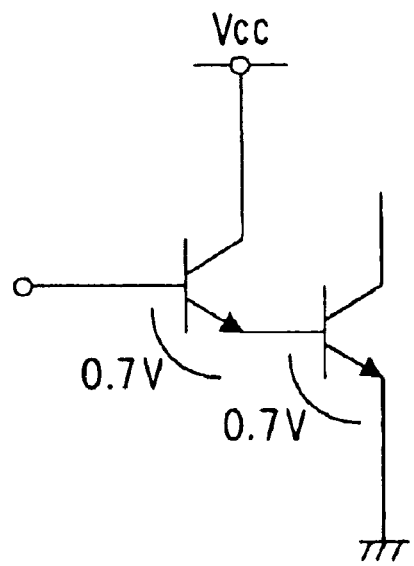
FIG. 7A is a schematic diagram showing an operational amplifier having an NPN transistor-type input stages.
Figure 7B:
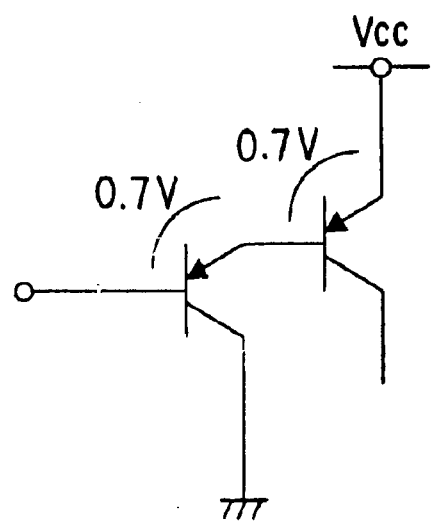
FIG. 7B is a schematic diagram showing an operational amplifier having a PNP transistor-type input stages.

The operational amplifier 20 has PNP transistor-type input stages shown in FIG. 7B. An operational amplifier having NPN transistor-type input stages is shown in FIG. 7A. This amplifier only operates when the input voltage is in the range between 1.4 V and the operating voltage Vcc. On the other hand, the amplifier 20 operates when the input voltage is in the range between 0 V and the operatiing Voltage Vcc −1.4 V.

Because a voltage close to the battery voltage VB is applied to the lamps L1–Ln, the input of the operational amplifier 20 is higher than the voltage Vcc −1.4 V. Therefore, the operational amplifier having the NPN transistor-type input stages is applicable. However, this amplifier cannot outputs the voltage lower than 1.4 V. Therefore, the amplifier having the PNP transistor-type input stages is used for the operational amplifier 20.

Even so, the voltage Va, which is close to the battery voltage VB, can be properly detected since the voltage VP, which is higher than the battery voltage VB, is supplied to the operational amplifier 20. Moreover, the dynamic range of the operational amplifier circuit can be set in a wide range, between 0 V and the maximum voltage Vmax (4.5 V in this embodiment) that the microcomputer 18 can read. Therefore, the amplification factor (gain) of the differential amplifier circuit 14 can be set to a value as large as necessary.

When the voltage Vout of the differential amplifier 14 is inputted, the microcomputer 18 compares digital data of the voltage Vout with digital data of the reference voltage Vth. If the voltage Vout is lower than the reference voltage Vth, the microcomputer 18 determines that disconnection exists in the lamps L1–Ln, and starts a preprogrammed fail-safe operation. The microcomputer 18 corrects the output voltage Vout or the reference voltage Vth based on the output error data stored in the EEPROM 36 when performing the disconnection determination.

In the charge pump circuit 30, the transistor 56 is turned on and off in a constant cycle by control signals from the microcomputer 18. When the transistor 56 turns on, the transistor 40 turns on and the transistor 43 turns off. When the transistor 56 turns off, the transistor 40 turns off and the transistor 43 turns on. The capacitor 48 is charged to the battery voltage VB and discharged by on/off operations of the transistors 40, 43, 56. As a result, the capacitors 49, 50 are charged to voltages higher than the battery voltage VB. Then, the voltage VP increased to approximately two times higher than the battery voltage VB is supplied to the operational amplifier 20 as the operating voltage Vcc.

In this embodiment, the microcomputer 18 corrects the output voltage Vout or the reference voltage Vth based on the output error data stored in the EEPROM 36. Then, it performs the disconnection detection. Therefore, the apparatus 1 can perform accurate disconnection detection without being affected by the characteristic of the differential amplifier circuit 14. This can reduce parts calibration, especially resistance calibration of the resistors 21–24, in the manufacturing process of the apparatus 1.

Figure 8:
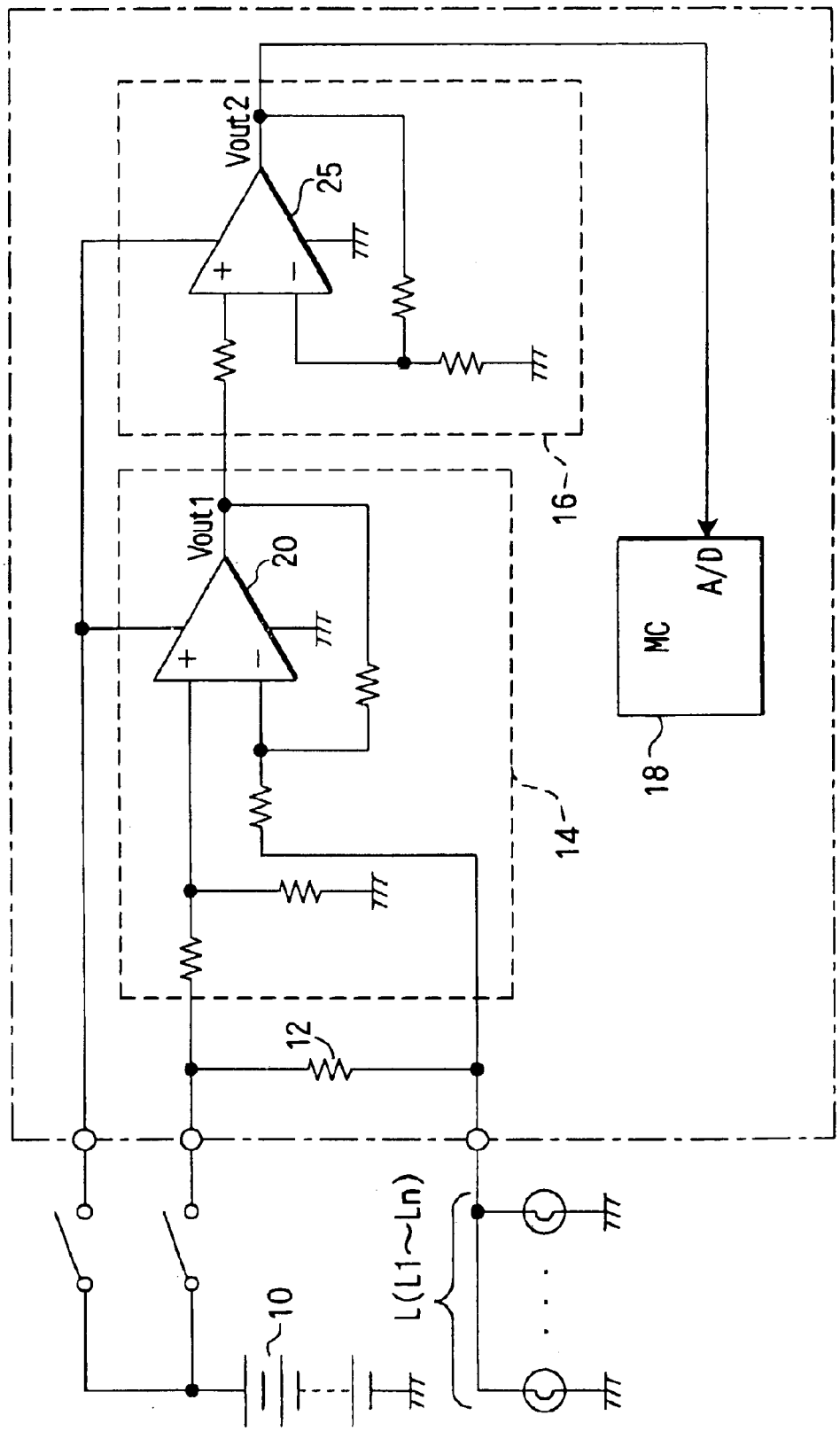
FIG. 8 is a circuit diagram showing a disconnection detecting apparatus of the related art.

Even though the amplification is performed only by the differential amplifier circuit 14, the input voltage Va is amplified large enough for the disconnection determination. As a result, an accurate determination can be made. Even in the case that only one of the lamps L1–Ln is disconnected, the disconnection is properly detected. Moreover, the apparatus 1 can be constructed small in size and low in price because it does not include noninverting amplifier circuit 16 shown in FIG. 8. However, the apparatus 1 still provides accurate disconnection detection.

Second Embodiment

Figure 2:
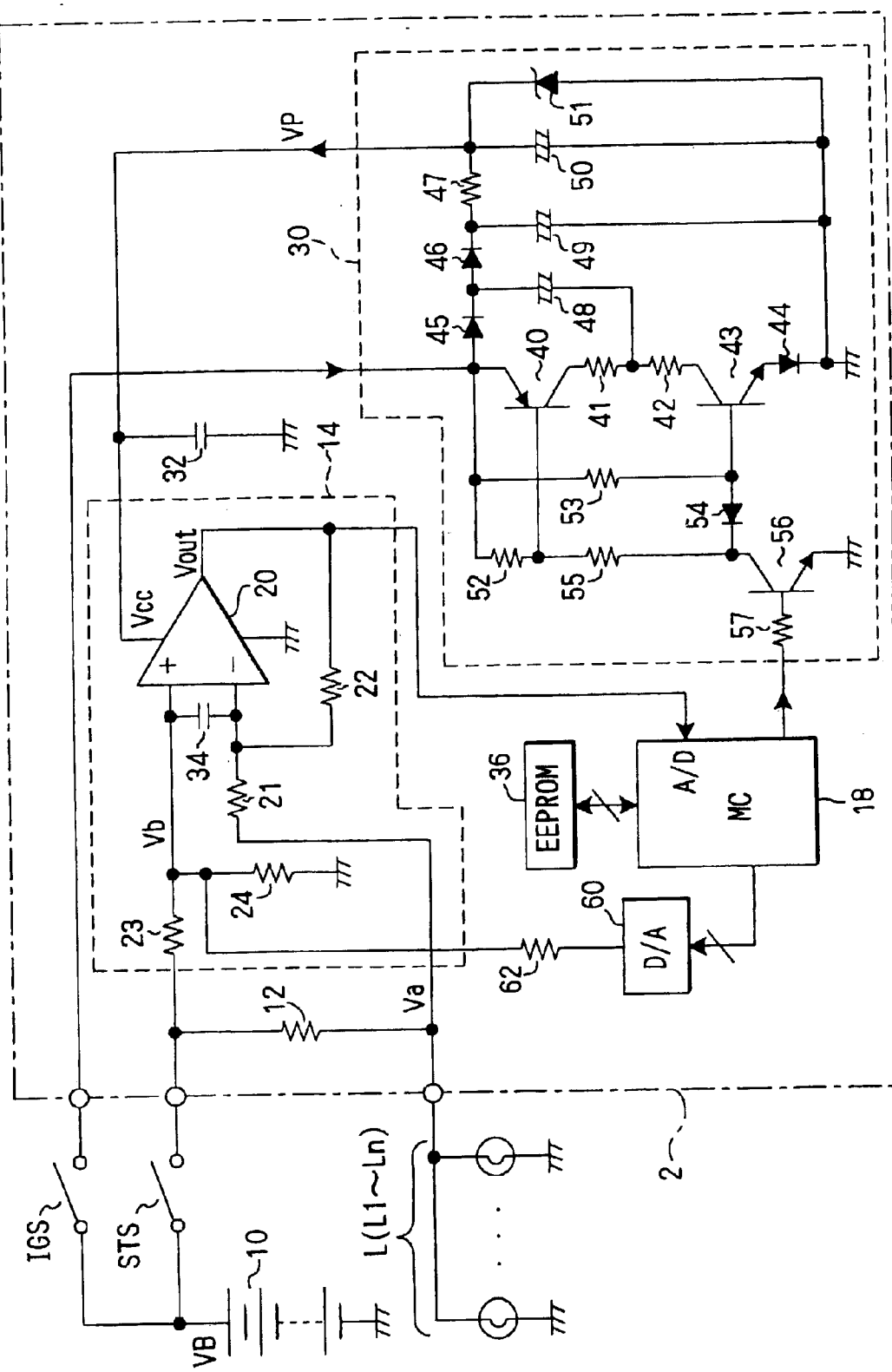
FIG. 2 is a circuit diagram showing a disconnection detecting apparatus of the second embodiment of the present invention.

Referring to FIG. 2, a disconnection detecting apparatus 2 includes a D/A converter 60 and a resistor 62 in addition to the components shown in FIG. 1.

The D/A converter 60 outputs voltages corresponding to the digital data outputted from the microcomputer 18. Ends of the resistor 62 are connected to the output terminal of the D/A converter 60 and the noninverting terminal of the operational amplifier 20, respectively. A reference voltage Vb applied to the noninverting terminal of the operational amplifier 20 is adjusted based on data outputted from the microcomputer 18 to the D/A converter 60. The D/A converter 60 and the resistor 62 thus adjust a voltage to the noninverting terminal.

The EEPROM 36 stores data that the microcomputer 18 outputs to the D/A converter 60 to reduce output errors of the differential amplifier circuit 14. The microcomputer 18 outputs a signal to the D/A converter 60 based on the stored data during the disconnection determination. The output characteristics of the differential amplifier circuit 14 vary as the reference voltage Vb varies. Therefore, output errors of the differential amplifier circuit 14 can be reduced by adjusting the reference voltage Vb. For this adjustment, the data that microcomputer 18 outputs to the D/A converter 60 to reduce the output errors is stored in the EEPROM36.

In the manufacturing process of the apparatus 2, a current Is is fed to the resistor 12 so that the output voltage Vout becomes the predetermined voltage S. When the microcomputer 18 receives an instruction signal, it adjusts its output voltage to the D/A converter 60 so that the output voltage Vout becomes the predetermined value S. The data on the adjusted output is stored in the EEPROM 36 as an adjustment data for the reference voltage Vb. For instance, a current is fed through the resistor 12 for the amount that the output voltage Vout becomes 3 V. If the measured output voltage Vout is 3.1 V, the microcomputer 18 reduces the output voltage of the D/A converter. Then, the output of the D/A converter 60 at the time when the voltage Vout=3 V is stored in the EEPROM 36. The microcomputer 18 outputs the stored data to the D/A converter 60 during the disconnection detection in regular operating mode.

Therefore, the apparatus 2 can perform accurate disconnection detection without being affected by the characteristics of the differential amplifier circuit 14.

Third Embodiment

Figure 3:
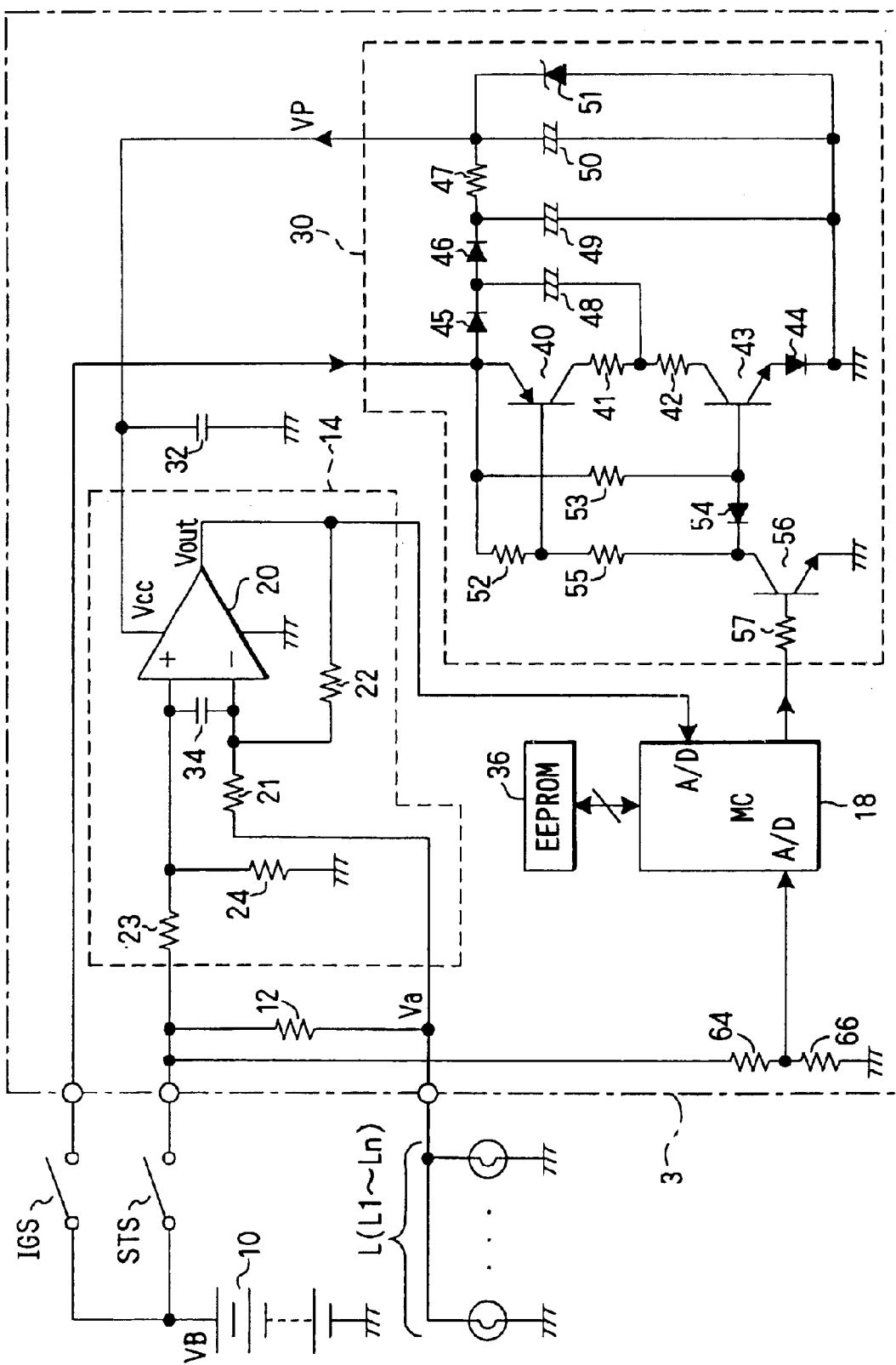
FIG. 3 is a circuit diagram showing a disconnection detecting apparatus of the third embodiment of the present invention.

Referring to FIG. 3, a disconnection detecting apparatus 3 includes a voltage divider constructed of a pair of resistors 64, 66 in addition to the components shown in FIG. 1.

The resistors 64, 66 are connected in series between the terminal to which the battery voltage is applied via the stop switch STS and the ground. A voltage that appears at the connecting point of the resistors 64, 66 is applied to an A/D terminal of the microcomputer 18. The battery voltage VB is divided by the resistors 64, 66 and inputted to the microcomputer 18. The A/D terminal for the resistors 64, 66 is different from the A/D terminal to which the voltage Vout is inputted.

The microcomputer 18 determines the battery voltage VB based on the divided voltage. The microcomputer 18 corrects the reference voltage Vth in response to the detected battery voltage VB for the disconnection detection.

Figure 4:
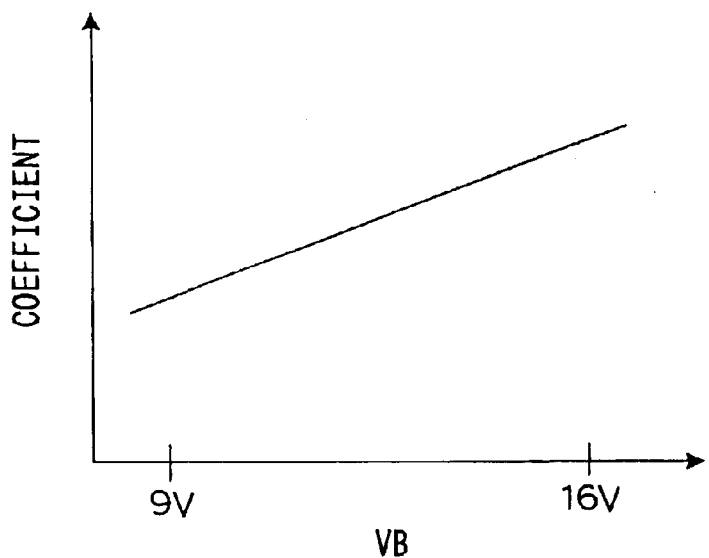
FIG. 4 is a graph showing a relationship between a battery voltage VB and an adjusting coefficient of a reference value.

A data map shown in FIG. 4 is stored in a ROM included in the microcomputer 18. The data map shows relationship between a correction coefficient of the reference voltage Vth and the battery voltage VB. The map may be plotted based on average resistances of the lamps L1–Ln so that the instability in resistances of the lamps L1–Ln does not affect.

The microcomputer 18 reads the correction coefficient corresponding to the detected battery voltage VB from the data map. The microcomputer 18 multiplies the reference voltage Vth by the coefficient. The calculated reference voltage Vth is used for the disconnection determination. The reference voltage Vth is corrected to a higher value as the battery voltage becomes higher. This is because the output voltage Vout of the differential amplifier circuit 14 becomes higher as the battery voltage VB becomes higher.

The apparatus 3 can accurately detect disconnection for more lamps L1–Ln even when the battery voltage VB varies. That is, a difference between the voltage Va under the normal condition and the voltage Va under the condition that one of the lamps is disconnected becomes smaller as the number of lamps increases. Therefore, the voltage Vout under the abnormal condition is higher than the voltage Vout under the normal condition when the battery voltage VB increases. As a result, the disconnection may not be properly detected. This is the same in the case that one of the lamps L1–Ln rated in lower watt is included and disconnected.

In the apparatus 3, the reference voltage Vth is corrected to a higher level as the battery voltage VB increases. Therefore, the above problems can be reduced.

Fourth Embodiment

Figure 5:
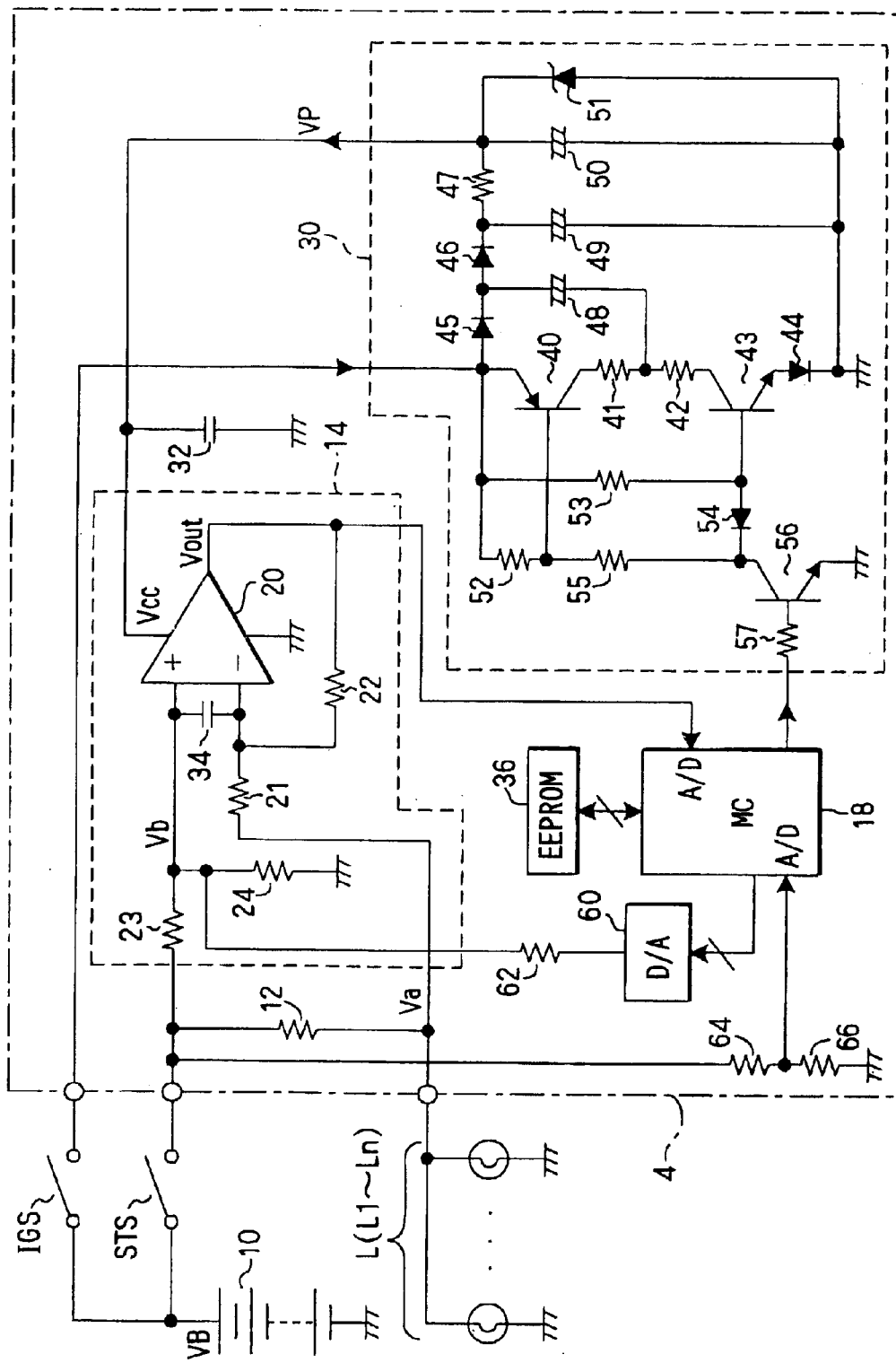
FIG. 5 is a circuit diagram showing a disconnection detecting apparatus of the fourth embodiment of the present invention.

Referring to FIG. 5, a disconnection detecting apparatus 4 includes a voltage divider constructed of a pair of resistors 64, 66 in addition to the components shown in FIG. 2.

The microcomputer 18 determines that disconnection exists when the output voltage Vout of the differential amplifier 14 is lower than the reference voltage Vth. A voltage that appears at the connecting point of the resistors 64, 66 is applied to an A/D terminal of the microcomputer 18. The microcomputer 18 determines the battery voltage VB based on the divided voltage and corrects the reference voltage Vth in response to the detected battery voltage VB.

The reference voltage Vth is corrected to be higher as the battery voltage VB increases. This is because the output voltage Vout becomes higher as the battery voltage VB increases. Since the reference voltage Vth is corrected in response to the battery voltage VB, the disconnection detection is performed without being affected by the variation in the battery voltage VB.

With this configuration, the apparatus 4 can accurately detect disconnection for more lamps L1–Ln even when the battery voltage VB varies. The voltage Va under the normal condition and the voltage Va under the condition that one of the lamps is disconnected are illustrated in FIG. 6A. The difference between the two becomes smaller as the number of lamps increases. Therefore, the voltage Vout under the abnormal condition is higher than the voltage Vout under the normal condition when the battery voltage VB increases. As a result, the disconnection may not be properly detected. This is the same in the case that one of the lamps L1–Ln rated in lower watt is included and disconnected.

However, the reference voltage Vth is corrected in response to the battery voltage VB in the apparatus 4. Therefore, the disconnection detection is properly performed without being affected by the variation in the battery voltage VB.

The present invention should not be limited to the embodiments previously discussed and shown in the figures, but may be implemented in various ways without departing from the spirit of the invention.

For example, it is preferable that the differential amplifier circuit 14 has an offset so that the output voltage Vout is within the range that the microcomputer 18 can read. If it is necessary to detect disconnection of m lamps out of the lamps L1–Ln, the offset may be set so that the output voltage Vout remains higher than 0 V even when the m lamps are disconnected. By setting the offset, the output voltage Vout corresponding to conditions of each lamp L1–Ln can be maintained to be within the voltage range that the microcomputer 18 can read. As a result, the apparatuses 1–4 can perform accurate disconnection detection.

In the case of detecting disconnection of m lamps out of the lamps L1–Ln, the output voltage Vout becomes lower as the number of the disconnected lamps increases. When m–1 lamps are disconnected and the output voltage Vout becomes lower than 0 V, the disconnection of m lamps cannot be determined. If the offset is set, the above situation may not occur. As a result, further accurate disconnection detection can be performed.

Furthermore, parts calibration, especially resistance calibration of the resistors 21–24, in the manufacturing process of the apparatus 1–4 becomes easier. This is because saturating conditions, in which the output voltage Vout becomes 0 V regardless of the voltage Va, can be reduced by setting the offset. Therefore, calibrating the resistance of the resistors 21–24 while measuring the output voltage Vout becomes easier since it is performed under more stable conditions.

The D/A converter 60 may be removed from the apparatus 2 if the reference voltage Vb of the operational amplifier 20 never exceeds an operating voltage (5V±10%) of the microcomputer 18. In this case, a signal corresponding to an adjustment data is applied from a D/A converter integrated into the microcomputer 18 to a resistor 62.

The microcomputer 18 may calculate the correction coefficient of the reference voltage Vth from a predetermined arithmetic expression instead of the data map. In this case, the battery voltage VB or the voltage divided by the resistors 64, 66 are used for the calculation.

The map can be a plot of the correction coefficient of the reference voltage Vth versus the voltage divided by the resistors 64, 66.

What is claimed is:

1. An electrical load disconnection detecting apparatus comprising:

a resistor for current-voltage conversion, connected in series with a path for supplying power from a power source to an electrical load;

a charge pump circuit that amplifies a power supply voltage produced by the power source and outputs a boosted voltage higher than the power supply voltage;

a differential amplifier circuit that includes an operational amplifier that is supplied with the boosted voltage as an operating voltage, and receives a voltage that appears at ends of the resistor as an input; and a determination means that receives an output voltage of the differential amplifier circuit, and determines a disconnection of the electrical load by comparing the output voltage of the differential amplifier circuit and a reference.

2. The electrical load disconnection detecting apparatus as in claim 1, further comprising:

a nonvolatile memory that stores output error data of the differential amplifier circuit, wherein the determination means performs the determination after correcting any one of the output voltage of the differential amplifier circuit and the reference voltage with the stored error data.

3. The electrical load disconnection detecting apparatus as in claim 1, further comprising:

a voltage adjusting means that adjusts the voltage applied from the resistor to the differential amplifier circuit in response to a signal from the determination means; and a nonvolatile memory that stores data that the determination means outputs to the voltage adjusting means to reduce output errors of the differential amplifier circuit, wherein the determination means determines a condition of electrical load connection while outputting the data stored in the nonvolatile memory to the voltage adjusting means.

4. The electrical load disconnection detecting apparatus as in claim 1, wherein the determining means detects the power supply voltage and corrects the reference in response to a voltage produced by the resistor.

5. The electrical load disconnection detecting apparatus as in claim 1, wherein the differential amplifier circuit has an offset so that the output voltages of the differential amplifier, corresponding to conditions of the electrical loads, remain within a voltage range that is detectable by the determining means.

* * * * *